United States Patent
Nakaya et al.

(10) Patent No.: US 6,188,176 B1
(45) Date of Patent: *Feb. 13, 2001

(54) ORGANIC ELECTROLUMINESCENT DEVICE AND PREPARATION METHOD WITH ITO ELECTRODE (111) ORIENTATION

(75) Inventors: Kenji Nakaya, Ibaraki; Yasunaga Kagaya, Chiba; Mitsufumi Codama, Ibaraki; Osamu Onitsuka, Chiba, all of (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/109,062

(22) Filed: Jul. 2, 1998

(30) Foreign Application Priority Data

Jul. 15, 1997 (JP) .................................................. 9-205196
Jun. 2, 1998 (JP) ................................................ 10-169202

(51) Int. Cl.[7] .............................................. H01J 63/04
(52) U.S. Cl. ............................................ 313/504; 445/46
(58) Field of Search .................................. 313/498, 499, 313/500, 501, 502, 503, 504, 505, 506; 445/46; 428/690, 691; 427/108, 126.2, 126.3

(56) References Cited

U.S. PATENT DOCUMENTS

| | | | |
|---|---|---|---|
| 4,775,820 | * 10/1988 | Eguchi et al. | 313/504 |
| 4,885,211 | * 12/1989 | Tang et al. | 428/457 |
| 5,861,307 | * 1/1999 | Kuchino et al. | 435/320.1 |
| 5,981,092 | * 11/1999 | Arai et al. | 428/690 |
| 6,060,826 | * 5/2000 | Ueda et al. | 313/498 |

FOREIGN PATENT DOCUMENTS

| | | |
|---|---|---|
| 0 549 345 | 6/1993 | (EP) . |
| 63-202890 | 8/1988 | (JP) . |
| 1-259320 | 10/1989 | (JP) . |
| 4-087187 | 3/1992 | (JP) . |
| 7-90550 | 4/1995 | (JP) . |
| 8-167479 | 6/1996 | (JP) . |
| 8-185983 | 7/1996 | (JP) . |
| 9-007770 | 1/1997 | (JP) . |

OTHER PUBLICATIONS

0083–0855–0 U.S. application No. 09/109,062, filed Jul. 2, 1998, pending.

* cited by examiner

*Primary Examiner*—Vip Patel
*Assistant Examiner*—Matthew J. Gerike
(74) *Attorney, Agent, or Firm*—Oblon, Spivak, McClelland, Maier & Neustadt, P.C.

(57) ABSTRACT

An organic EL device includes a substrate (21), a hole infecting electrode (22), an electron injecting electrode (25), and organic layers (23, 24) disposed between the electrodes. The hole injecting electrode (22) is an ITO electrode having (111) orientation. Due to improved film formation, close contact and physical properties at the interface between the hole injecting electrode and the organic layer, the device has a long lifetime, high luminance, high efficacy, and quality display and prevents the occurrence of current leakage and dark spots.

6 Claims, 4 Drawing Sheets

ORGANIC ELECTROLUMINESCENT DEVICE AND PREPARATION METHOD WITH ITO ELECTRODE (111) ORIENTATION

TECHNICAL FIELD

This invention relates to an organic electroluminescent (EL) device using an organic compound and a method for preparing the same. More particularly, it relates to an organic EL device comprising an improved hole injecting electrode for feeding holes to a light emitting layer.

BACKGROUND ART

Recently, active research works have been made on organic EL devices. As a basic configuration, the organic EL device includes a hole injecting electrode, a thin film formed thereon by evaporating a hole transporting material such as triphenyldiamine (TPD), a light emitting layer deposited thereon of a fluorescent material such as an aluminum quinolinol complex (Alq3), and a metal electrode or electron injecting electrode formed thereon from a metal having a low work function such as magnesium. Such organic EL devices are attractive in that they can achieve a very high luminance ranging from several 100 to several 10,000 cd/m$^2$ with a drive voltage of approximately 10 volts.

With respect to the material used as the hole injecting electrode of such organic EL devices, a material capable of injecting more holes into the light emitting layer or the hole injecting and transporting layer is believed effective. The hole injecting material is also required to be transparent and electroconductive because in many arrangements, emitted light exits from the substrate side.

Transparent electrodes known to this end include tin-doped indium oxide (ITO), zinc-doped indium oxide (IZO), ZnO, SnO$_2$, and In$_2$O$_3$. Of these, ITO electrodes are widely used as transparent electrodes in liquid crystal displays (LCD), dimmer glass and solar cells because they have both a visible light transmittance of 90% or higher and a sheet resistivity of 10 Ω/or lower. ITO electrodes are considered promising as the hole injecting electrode in organic EL devices.

Organic EL devices tend to deteriorate with the lapse of time. It is a key task to prevent the EL devices from deteriorating. While various factors cause to deteriorate EL devices, the deterioration at a film interface, for example, between an electrode and an organic layer has a significant influence on the lifetime and light emission of EL devices. It is thus important to modify physical properties at the film interface. It is also necessary to prevent an abnormal light emitting phenomenon due to current leakage and a phenomenon of generating and propagating non-luminous regions known as dark spots.

SUMMARY OF THE INVENTION

An object of the present invention is to provide an organic EL device in which the film formation, close contact and physical properties at the interface between a hole injecting electrode and an organic layer are improved so that the device may have a long lifetime, high luminance, high efficacy, and quality display.

Another object of the present invention is to provide an organic EL device which can prevent the occurrence of current leakage and dark spots.

For the purpose of modifying the physical properties at a film interface in organic EL devices, we focused at the orientation of transparent ITO electrodes. We have found that an ITO thin film whose main orientation plane is (222) experiences little deterioration at its interface with an overlying film. We have also found that the occurrence of current leakage and dark spots can be effectively suppressed by restricting the surface roughness of a substrate and an ITO thin film deposited thereon so as to fall within a specific range.

According to the invention, there is provided an organic electroluminescent device comprising a substrate having a surface, a hole injecting electrode disposed on the substrate surface, an electron injecting electrode, and at least one organic layer disposed between the electrodes. The hole injecting electrode comprises an ITO electrode having (111) orientation. Preferably, when analyzed for x-ray diffraction by the rotating crystal method, the ITO electrode exhibits a diffraction intensity ratio of (400)/(222) reflection of up to 0.6; and also preferably, the ITO electrode exhibits an integrated intensity ratio of (400)/(222) reflection of up to 0.5.

In one preferred embodiment, the substrate has a mean surface roughness Ra of up to 10 nm and a maximum surface roughness Rmax of up to 50 nm; and the ITO electrode at its surface remote from the substrate has a mean surface roughness Ra of up to 10 nm and a maximum surface roughness Rmax of up to 50 nm.

Also contemplated herein is a method for preparing an organic electroluminescent device comprising the steps of forming an ITO electrode on a substrate at a substrate temperature of 10° C. to 150° C., and heat treating the electrode at 100° C. to 450° C.

BEST MODE FOR CARRYING OUT THE INVENTION

Figure 1:
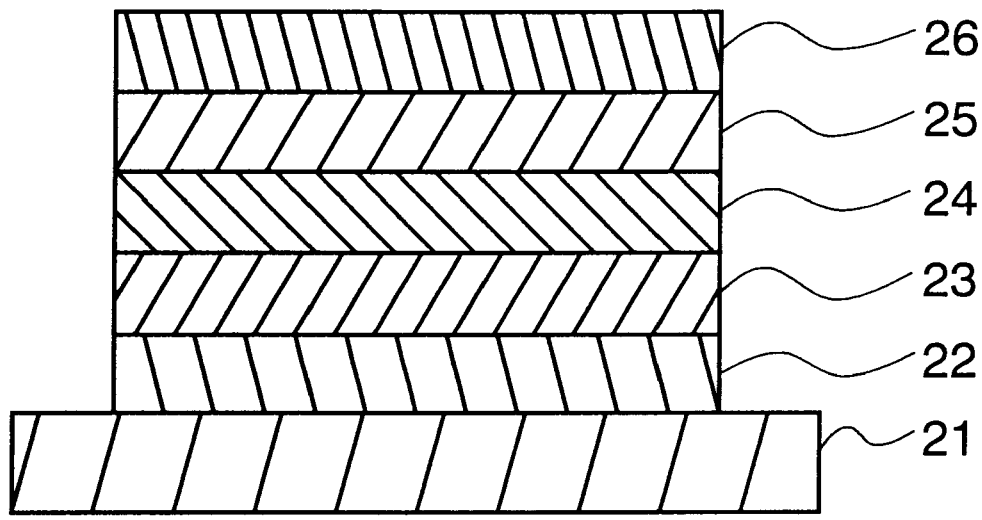
FIG. 1 is a schematic view illustrating one exemplary construction of an organic EL device.

The organic EL device of the invention includes a substrate having a surface, a hole injecting electrode disposed on the substrate surface, an electron injecting electrode, and at least one organic layer disposed between the electrodes. The hole injecting electrode is an ITO electrode whose main orientation is (111). The setting of main orientation (111) is effective for improving physical properties at the interface between the hole injecting electrode and the organic layer, thereby improving the light emission characteristics and life of the device and the quality of light emission and display.

Any ITO electrode is used in the invention as long as a (222) plane is detected as the main orientation plane. It is acceptable that other planes such as (400), (211) and (411) are detected as additional orientation, but at a significantly lower level than the main orientation. The setting of main orientation (111) for the ITO electrode preferably means that when analyzed for x-ray diffraction by the rotating crystal method, also known as θ/2θ method, the ITO electrode exhibits a diffraction intensity ratio of (400)/(222) reflection of up to 0.6, more preferably up to 0.5, and most preferably from 0.4 to 0.1. Differently stated, upon x-ray diffraction analysis by the rotating crystal method, the ITO electrode preferably exhibits an integrated intensity ratio of (400)/(222) reflection of up to 0.5, more preferably up to 0.4, and most preferably from 0.3 to 0.1.

In general, the ITO contains $In_2O_3$ and $SnO_2$ in a stoichiometric composition although the quantity of oxygen may deviate more or less therefrom. When ITO is represented by the formula: $InO_x \cdot SnO_y$, it is preferred that x is from 1.0 to 2.0 and y is from 1.6 to 2.4. The amount of $SnO_2$ mixed with $In_2O_3$ is preferably 1 to 20% by weight, more preferably 5 to 12% by weight of the mixture. The ITO thin film usually has a grain size of about 0.001 to about 1 µm although the grain size is not critical.

The transparent positive electrode of ITO should preferably have at least a sufficient thickness to perform hole injection. Specifically, the thickness of the ITO electrode is preferably about 10 to 500 nm, more preferably about 50 to 300 nm. The upper limit is not so strict although too thick an electrode has a risk of peeling. A too thin electrode is undesirable from the standpoints of film strength during manufacture and a hole transporting ability.

The transparent positive electrode of ITO may be formed by evaporation, sputtering and other processes although the sputtering is preferred. When a transparent ITO electrode is formed by sputtering, it is recommended to employ a DC or RF sputtering process using a target of $In_2O_3$ doped with $SnO_2$. The transparent ITO electrode formed by sputtering experiences a less change with time of light emission luminance than the electrode formed by evaporation. The input power is preferably about 0.1 to 10 W/cm$^2$, and more preferably about 0.1 to 4 W/cm$^2$. Particularly when a DC sputtering apparatus is used, the input power is preferably about 0.1 to 10 W/cm$^2$, and more preferably about 0.2 to 7 W/cm$^2$. The deposition rate is preferably about 2 to 100 nm/min., and more preferably about 5 to 50 nm/min.

The sputtering gas is not critical. There may be used an inert gas such as Ar, He, Ne, Kr and Xe or a mixture thereof. Less than 20% of $O_2$ may be added to the inert gas. During sputtering, the sputtering gas is usually kept under a pressure of about 0.1 to 20 Pa.

During deposition, the substrate is preferably kept at a temperature of about 10 to 150° C., especially about 20 to 100° C. Too higher substrate temperatures would promote the crystal growth too much, with the difficult of acquiring (222) orientation.

After deposition, the ITO thin film is preferably heat treated in order that (222) film orientation may become predominant. Heat treatment effectively yields (222) oriented crystals. For this heat treatment, the temperature is preferably 100 to 450° C., more preferably 150 to 300° C. and the time is preferably 0.1 to 3 hours, more preferably 0.3 to 1 hour. The preferred atmosphere for heat treatment is air, nitrogen, oxygen or hydrogen-added nitrogen.

In one preferred embodiment of the invention, the substrate has a surface roughness below a specific value. By restricting the surface roughness of the substrate below the specific value, the occurrence of current leakage and the generation and propagation of non-luminous regions known as dark spots are suppressed.

As the substrate, transparent or translucent materials such as glass, quartz and resins are used. Glass substrates are preferred among others because they are inexpensive, readily available, light transmissive and excellent in physical properties. Glass substrates are generally classified into alkali glass and alkali-free glass. Alkali glass is economically advantageous in that it is inexpensive and readily available. However, since alkali glass contains about 13 to 14% of alkali metal oxides, a countermeasure for preventing contamination with such alkali metals is necessary. Another drawback of alkali glass is poor heat resistance. On the other hand, alkali-free glass is free of the risk of alkali metal contamination and has certain heat resistance, but is relatively expensive.

One known example of the alkali glass is soda lime glass having the composition of 72% $SiO_2$, 2% $Al_2O_3$, 8% CaO, 4% MgO, and 13.5% $Na_2O$. Known examples of the alkali-free glass include borosilicate (7059) glass having the composition of 49% $SiO_2$, 10% $Al_2O_3$, 15% $B_2O_3$, and 25% BaO (commercially available from Corning Glass Works); borosilicate (AN) glass having the composition of 53% $SiO_2$, 11% $Al_2O_3$, 11% $B_2O_3$, 2% CaO, 2% MgO, 15% BaO, and 6% ZnO; and borosilicate (NA-40) glass having the composition of 54% $SiO_2$, 14% $Al_2O_3$, 15% $B_2O_3$, and 25% MgO. Note that percents are by weight.

The glass substrate preferably has a mean surface roughness Ra of up to 10 nm and a maximum surface roughness Rmax of up to 50 nm. More specifically, substrates of alkali glass preferably have Ra≦10 nm and Rmax≦50 nm, and substrates of alkali-free glass preferably have Ra≦5 nm and Rmax≦20 nm. The lower limit is not critical although in most cases, the mean surface roughness Ra is at least 0.1 nm and the maximum surface roughness Rmax is at least 0.5 nm.

For adjusting the surface roughness of glass substrates to the above-defined range, the substrate surface may be mirror polished using diamond grits or cerium oxide.

When alkali glass is used as the substrate, it is recommended to form a barrier layer of $SiO_2$ or the like on the substrate and then form an ITO electrode thereon for the purpose of preventing the electrode from being contaminated with alkali metal components from the substrate. The barrier layer may be formed by evaporation or sputtering and to a thickness of about 5 to 50 nm. When the barrier layer is formed on the substrate of alkali glass, the substrate may have a mean surface roughness Ra of up to 10 nm and a maximum surface roughness Rmax of up to 50 nm.

The ITO electrode layer formed on the substrate having a surface roughness within the above-defined range preferably has a mean surface roughness Ra of up to 10 nm, especially up to 5 nm, and a maximum surface roughness Rmax of up to 50 nm, especially up to 30 nm, as measured at its surface remote from the substrate.

As previously described, the organic EL device of the invention has a hole injecting electrode on a substrate and an electron injecting electrode thereon. The device further has at least one charge transporting layer and at least one light emitting layer which are disposed between the electrodes, and a protective electrode as the uppermost layer. The charge transporting layer may be omitted. The electron injecting electrode is constructed from a metal, compound or alloy having a low work function by evaporation or sputtering, preferably by sputtering whereas the hole injecting electrode is constructed as above.

The materials of which the electron injecting electrodes are formed are preferably those materials having a low work function to perform effective electron injection, for example, metal elements such as K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb; and compounds such as BaO, BaS, CaO, HfC, $LaB_6$, MgO, MoC, NbC, PbS, SrO, TaC, ThC, $ThO_2$, ThS, TiC, TiN, UC, UN, $UO_2$, $W_2C$, Y2O3, ZrC, ZrN, and $ZrO_2$. Binary and ternary alloys containing two or three metal elements are effective for improving stability. Exemplary alloys are aluminum alloys such as Al—Ca (Ca: 0.01 to 20 at %, especially 5 to 20 at %), Al—In (In: 1 to 10 at %), and Al—Li (Li: 0.01 to 14 at %, especially 0.3 to less than 14 at %); and In—Mg (Mg: 50 to 80 at %). Of these, elemental aluminum and aluminum alloys such as Al—Li (Li: 0.4 to less than 6.5 at %) or (Li: 6.5 to 14 at %) are preferred because they are relatively free from compression stresses. Then, for sputtering, targets of such electron injecting electrode-forming metals or alloys are used. These materials should preferably have a work function of up to 4.5 eV, with metals and alloys having a work function of up to 4.0 eV being especially preferred.

The use of the sputtering process in forming the electron injecting electrode has several advantages. The electron injecting electrode film formed by the sputtering process is improved in adhesion at the interface with the organic layer because as compared with the evaporation process, the sputtered atoms and atomic groups acquire relatively high kinetic energy so that the surface migration effect may occur. Also, since the surface oxide layer can be removed in vacuum by effecting pre-sputtering or the moisture and oxygen which have adsorbed on the organic layer interface can be removed by effecting back sputtering, it is possible to form a clean electrode-organic layer interface and a clean electrode and eventually, to fabricate an organic EL device of quality and stable performance. Alloys within the above-defined compositional range or elemental metals may be used as the target while targets of such alloys or metals with any desired component added are also acceptable. Further, even when a mixture of materials having significantly different vapor pressures is used as the target, there occurs only a slight shift in composition between the target and the film deposited therefrom, which eliminates the limits that are imposed on the materials by the vapor pressure or the like in the case of the evaporation process. The sputtering process is also advantageous in productivity as compared with the evaporation process, because it is unnecessary to supply the material for a long period of time and the resulting film is well uniform in thickness and quality.

Since the electron injecting electrode formed by the sputtering process is a dense film which minimizes the ingress of moisture as compared with an evaporated film of sparse packing, there can be obtained an organic EL device having high chemical stability and a long lifetime.

The pressure of the sputtering gas during sputtering is preferably in the range of 0.1 to 5 Pa. By controlling the pressure of the sputtering gas within this range, an Al-Li alloy having a lithium concentration within the above-defined range can be easily obtained. Also, by changing the pressure of the sputtering gas within this range during film deposition, an electron injecting electrode having a graded lithium concentration as described above can be easily obtained.

The sputtering gas may be an inert gas as used in conventional sputtering apparatus, and in the case of reactive sputtering, a reactive gas such as $N_2$, $H_2$, $O_2$, $C_2H_4$ and NH3 may be used in addition to the inert gas.

The sputtering process may be a high-frequency sputtering process using an RF power supply although a DC sputtering process is preferably used because the rate of film deposition is easily controllable and for the purpose of minimizing the damage to the organic EL device structure. The power to the DC sputtering apparatus is preferably in the range of 0.1 to 10 $W/cm^2$, especially 0.5 to 7 $W/cm^2$. Also, the rate of film deposition is preferably in the range of 5 to 100 nm/min., especially 10 to 50 nm/min.

The electron injecting electrode thin film may have a thickness equal to or in excess of a certain level necessary to carry out electron injection, typically at least 0.1 nm, preferably at least 1 nm, more preferably at least 3 nm. The upper limit of thickness is not critical although the film thickness generally ranges from about 1 nm to about 500 nm, more preferably from about 3 nm to about 500 nm.

The organic EL device of the invention may include a protective electrode on the electron injecting electrode, that is, on the surface of the electron injecting electrode which is disposed remote from the organic layer. The provision of the protective electrode is effective for protecting the electron injecting electrode from the surrounding atmosphere and moisture, preventing the thin films from deteriorating, stabilizing the efficiency of electron injection, and remarkably increasing the lifetime of the device. The protective electrode has a very low resistivity so that it may serve as a wiring electrode in case the electron injecting electrode has a high resistivity. This protective electrode contains at least one of aluminum, a mixture of aluminum and a transition metal (excluding titanium), titanium and titanium nitride (TiN). When these components are used alone, it is preferred that the protective electrode contain about 90 to 100 at % of Al, about 90 to 100 at % of Ti or about 90 to 100 mol % of TiN. When a mixture of two or more components is used, the mix ratio of the components is not critical. When a mixture of aluminum and titanium is used, the mixture preferably contains up to 10 at % of Ti. Alternatively, layers each composed of a single component are laid up. In particular, aluminum or a mixture of aluminum and a transition metal gives better results when used as the wiring electrode as will be described later; and titanium nitride is well corrosion resistant and thus effective as a sealing film. Titanium nitride (TiN) may deviate about 10% from its stoichiometry. The alloys of aluminum and a transition metal may contain transition metals such as mg, Sc, Nb, Zr, Hf, Nd, Ta, Cu, Si, Cr, Mo, Mn, Ni, Pd, Pt and W, preferably in a total amount of up to 10 at %, more preferably up to 5 at %, and most preferably up to 2 at %. The lower the content of transition metal, the lower becomes the thin film resistance when the electrode serves as a wiring conductor.

The protective electrode has a thickness sufficient to ensure efficient electron injection and prevent ingress of moisture, oxygen and organic solvents, preferably a thickness of at least 50 nm, more preferably at least 100 nm, and especially 100 to 1,000 nm. Too thin a protective electrode layer would fail to achieve the above effects or to provide step coverage so that its connection to a terminal electrode becomes insufficient. Too thick a protective electrode layer would accumulate more stresses, resulting in an increased growth rate of dark spots. In the embodiment wherein the protective electrode serves as the wiring electrode, the thickness of the protective electrode is usually about 100 to 500 nm when the electron injecting electrode is thin and has a high film resistance and the protective electrode must compensate for that film resistance, and otherwise about 100 to 300 nm.

The total thickness of the electron injecting electrode and the protective electrode combined is preferably about 100 to 1,000 nm though not critical.

Referring to FIG. 1, there is illustrated one exemplary construction of the organic EL device of the invention. The EL device shown in FIG. 1 includes on a substrate 21 and has a hole injecting electrode 22, a hole injecting and transporting layer 23, a light emitting and electron injecting and transporting layer 24, an electron injecting electrode 25, and a protective electrode 26 arranged on the substrate 21 in the described order.

The organic EL device of the invention is not limited to the illustrated construction, and various other constructions are possible. For example, it is acceptable to form a light emitting layer by itself and interleave an electron injecting and transporting layer between the light emitting layer and the electron injecting electrode. if necessary, the hole injecting and transporting layer may be mixed with the light emitting layer.

The hole and electron injecting electrodes are formed as previously described while organic material layers such as the light emitting layer may be formed by vacuum evaporation or the like. If necessary, each of these films is patterned by mask evaporation or by a suitable technique such as etching after film formation whereby the desired light emitting pattern is accomplished. In a further embodiment wherein the substrate bears thin film transistors (TFT), the respective films are formed in accordance with the TFT pattern so that the display and drive pattern may be provided without further processing.

Following the electrode formation, a protective film may be formed in addition to the protective electrode, using an inorganic material such as SiOx or an organic material such as Teflon and chlorine-containing fluorinated hydrocarbon polymers. The protective film may be either transparent or opaque and have a thickness of about 50 to 1,200 nm. Apart from the reactive sputtering process mentioned above, the protective film may also be formed by an ordinary sputtering or evaporation process.

Further preferably, a sealing or encapsulating layer may be formed on the device in order to prevent the organic layers and electrodes from oxidation. The sealing layer for preventing the ingress of moisture is formed by attaching a sealing plate such as a glass plate through an adhesive resin layer such as a sheet of a commercially available low moisture pickup photo-curable adhesive, epoxy adhesive, silicone adhesive, or crosslinking ethylene-vinyl acetate copolymer adhesive. Metal plates and plastic plates are useful as well as the glass plates.

Next, the organic material layers included in the organic EL device according to the invention are described.

The light emitting layer has the functions of injecting holes and electrons, transporting them, and recombining holes and electrons to create excitons. It is preferred that relatively electronically neutral compounds be used in the light emitting layer.

The hole injecting and transporting layer has the functions of facilitating injection of holes from the hole injecting electrode, transporting holes stably, and obstructing electron transportation. The electron injecting and transporting layer has the functions of facilitating injection of electrons from the electron injecting electrode, transporting electrons stably, and obstructing hole transportation. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique although their thickness is usually preferred to range from about 5 nm to about 500 nm, especially about 10 nm to about 300 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL device of the invention contains a fluorescent material that is a compound having a light emitting capability. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are phenylanthracene derivatives described in Japanese Patent Application No. 110569/1994 and the tetraarylethene derivatives described in Japanese Patent Application No. 114456/1994.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato)-aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato)-aluminum(III), bis(2-methyl-8-quinolinolato)(ortho-cresolato)aluminum(III), bis(2-methyl-8-quinolinolato)(meta-cresolato)aluminum(III), bis(2-methyl-8-quinolinolato)(para-cresolato)aluminum(III), bis(2-methyl-8-quinolinolato)-(ortho-phenylphenolato)aluminum (III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)-aluminum(III), bis(2-methyl-8-quinolinolato)(2,6-dimethyl-phenolato) aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato)-aluminum(III), bis(2-methyl-8-quinolinolato)(2,6-diphenyl-phenolato)aluminum(III), bis(2-methyl-8-quinolinolato)-(2, 4,6-triphenylphenolato)aluminum(III), bis(2-methyl-8-quinolinolato)(2,3,6-trimethylphenolato)aluminum(III), bis(2-methyl-8-quinolinolato)(2,3,5,6-tetramethylphenolato)-aluminum(III), bis(2-methyl-8-quinolinolato)(1-naphtholato)-aluminum(III), bis(2-methyl-8-quinolinolato)(2-naphtholato)-aluminum(III), bis(2,4-dimethyl-8-quinolinolato)(ortho-phenylphenolato)aluminum(III), bis(2,4-dimethyl-8-quinolinolato)(para-phenylphenolato)aluminum(III), bis(2,4-dimethyl-8-quinolinolato)(meta-phenylphenolato)-aluminum(III), bis(2,4-dimethyl-8-quinolinolato)(3,5-dimethylphenolato)aluminum(III), bis(2,4-dimethyl-8-quinolinolato)(3,5-di-tert-butylphenolato)aluminum(III), bis(2-methyl-4-ethyl-8-quinolinolato)(para-cresolato)-aluminum(III), bis(2-methyl-4-methoxy-8-quinolinolato)(para-phenylphenolato)aluminum(III), bis(2-methyl-5-cyano-8-quinolinolato)(ortho-cresolato)aluminum (III), and bis(2-methyl-6-trifluoromethyl-8-quinolinolato)(2-naphtholato)-aluminum(III).

Also acceptable are bis(2-methyl-8-quinolinolato)-aluminum(III)-$\mu$-oxo-bis(2-methyl-8-quinolinolato) aluminum (III), bis(2,4-dimethyl-8-quinolinolato)aluminum (III)-$\mu$-oxo-bis( 2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in Japanese Patent Application No. 110569/1994 and the tetraarylethene derivatives described in Japanese Patent Application No. 114456/1994.

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the dopant is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound is less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole injecting and transporting layer and compounds for the electron injecting and transporting layer to be described later, respectively. Inter alia, the compound for the hole injecting and transporting layer is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole injecting and transporting layer, there may be used various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraaryl-benzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the hole injecting electrode (ITO). It is also preferred to use a compound having good thin film forming ability at the hole injecting electrode surface. The order of lamination also applies where a plurality of hole injecting and transporting layers are provided. Such an order of lamination is effective for lowering the drive voltage and preventing current leakage and the development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer, the hole injecting and transporting layer may be formed by evaporating the above-mentioned compounds.

In the electron injecting and transporting layer which is optionally provided, there may be used quinoline derivatives including organic metal complexes having 8-quinolinol or a derivative thereof as a ligand such as tris(8-quinolinolato) aluminum, oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to laminate layers in such an order that a layer of a compound having a greater electron affinity may be disposed adjacent the electron injecting electrode. The order of lamination also applies where a plurality of electron injecting and transporting layers are provided.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to covert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, those materials which are not damaged upon deposition of ITO are preferred.

The light absorbing material is used when the light absorption of the fluorescent material is short and may be omitted if unnecessary. The light absorbing material may also be selected from materials which do not cause extinction of fluorescence of the fluorescent material.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of less than 0.1 μm. If the grain size is more than 0.1 μm, uneven light emission would take place and the drive voltage of the device must be increased with a substantial drop of electric charge injection efficiency.

The conditions for vacuum evaporation are not critical although a vacuum of $10^{-4}$ Pa or lower and an evaporation rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

The organic EL device of the invention is generally of the DC drive type while it can be of the AC or pulse drive type. The applied voltage is generally about 2 to 30 volts.

EXAMPLE

Experiments and Examples of the present invention are given below together with Comparative Examples and by way of illustration. Ra is the mean surface roughness and Rmax is the maximum surface roughness as defined above.

Experiment 1

Figure 2:
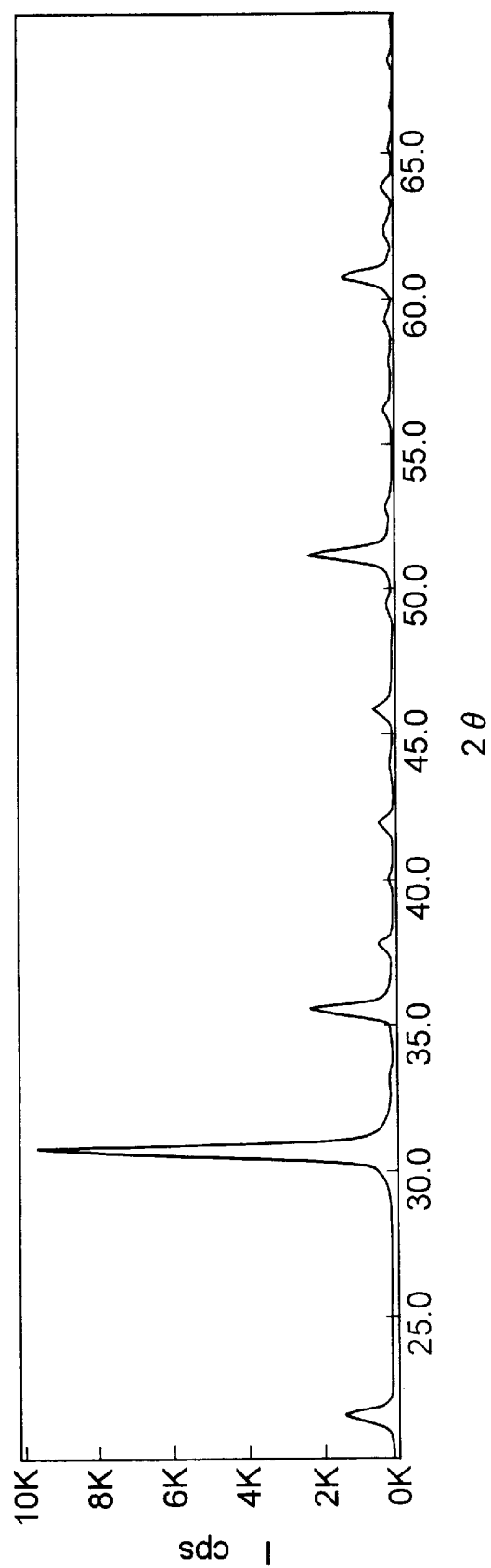
FIGS. 2, 3 and 4 are diagrams showing the results of x-ray diffraction by the rotating crystal method on the ITO thin films designated Sample Nos. 1, 2 and 3, respectively.

A substrate of (7059) glass by Corning Glass Works was placed in a vacuum chamber which was evacuated to a vacuum of $3.5 \times 10^{-4}$ Pa. By a sputtering process using ITO ($SnO_2$: 10% by weight) as the target, a mixture of argon and oxygen ($O_2/Ar+O_2$ 10%, $O_2$ partial pressure $9.3 \times 10^{-2}$ Pa) as the sputtering gas, a pressure of $4.0 \times 10^{-1}$ Pa during sputtering, and a DC sputtering power of 315 W (315 V, 1.0 A), an ITO thin film was deposited to a thickness of 100 nm. During film deposition, the substrate was at room temperature (25° C.). The ITO thin film thus obtained was analyzed to find a composition of 89.8% by weight $In_2O_3$ and 10.2% by weight $SnO_2$. The ITO thin film was heat treated in the ambient atmosphere at 300° C. for 1 hour. This ITO thin film, designated Sample No. 1, was analyzed for x-ray diffraction by the rotating crystal method or θ/2θ method. The measuring conditions included an XRD tube voltage of 40 kV, a tube current of 400 mA, a θ axis angle of 0.50°, a scanning range (2θ) of 20.0° to 70.0°, a sampling breadth of 0.050, a scanning rate of 4.000 deg/min., a divergent slit of 0.15 mm, a scattering slit of 4.00 mm, and a light receiving slit of 4.00 mm. The result is shown in FIG. 2. As seen from FIG. 2, a strong peak was observed at about 30° indicating the orientation of (222) face. Table 1 shows the diffraction intensity of (222) face, diffraction intensity of (400) face, diffraction intensity ratio of (400)/(222) face, integrated intensity of (222) face, integrated intensity of (400) face, and integrated intensity ratio of (400)/(222) face.

Experiment 2

Figure 3:
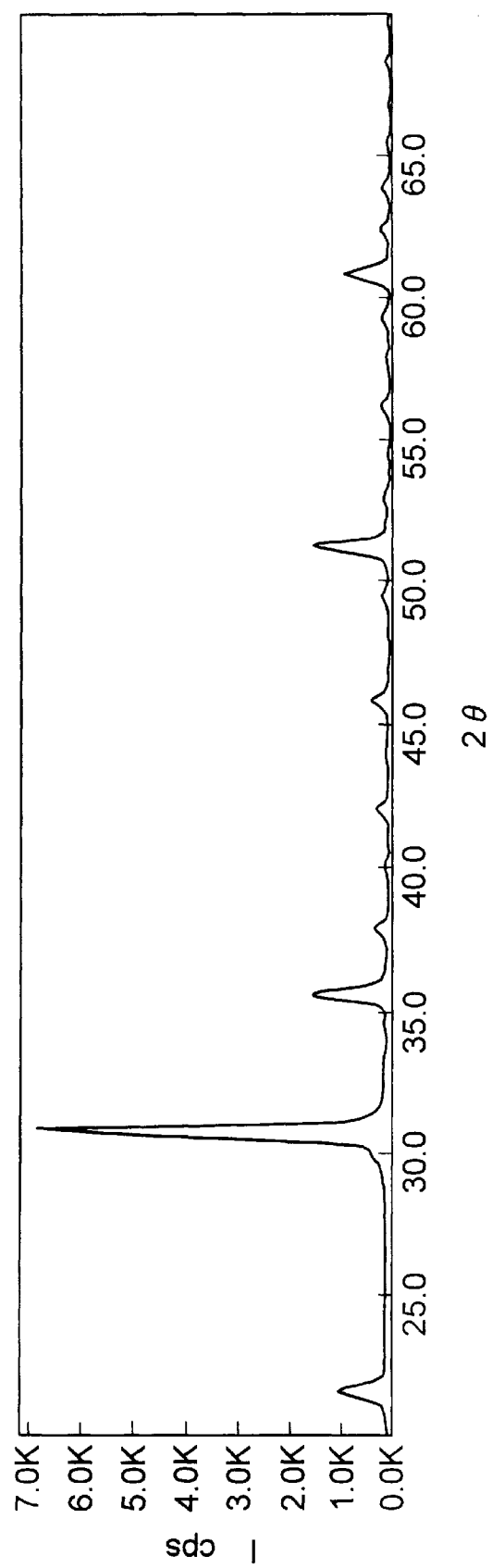

As in Experiment 1, on a substrate of Corning (7059) glass, an ITO thin film was deposited to a thickness of 100 nm. The ITO thin film had a composition of 89.6% by weight $In_2O_3$ and 10.4% by weight $SnO_2$. The ITO thin film was heat treated in a nitrogen atmosphere at 300° C. for 1 hour. This ITO thin film, designated Sample No. 2, was analyzed for x-ray diffraction as in Experiment 1. The result is shown in FIG. 3. As seen from FIG. 3, a strong peak was observed at about 30° indicating the orientation of (222) face. Table 1 shows the diffraction intensity of (222) face, diffraction intensity of (400) face, diffraction intensity ratio of (400)/(222) face, integrated intensity of (222) face, integrated intensity of (400) face, and integrated intensity ratio of (400)/(222) face.

Experiment 3

Figure 4:
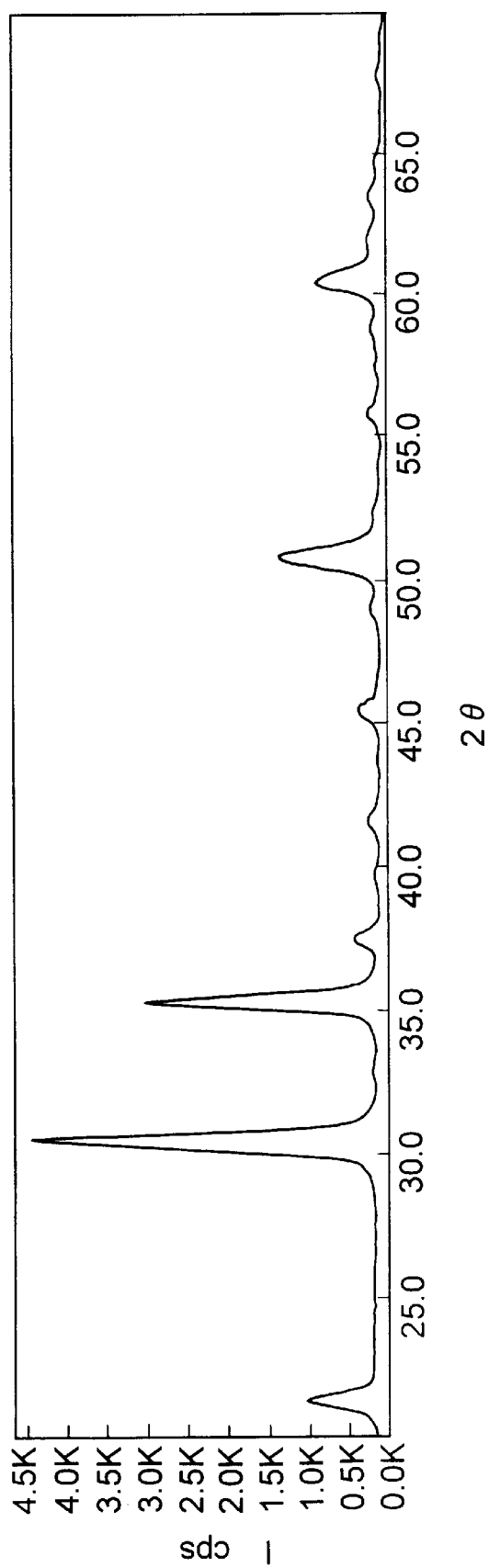

A substrate of Corning (7059) glass was placed in a vacuum chamber which was evacuated to a vacuum of $3.1 \times 10^{-3}$ Pa. By a sputtering process using ITO ($SnO_2$: 10% by weight) as the target, a mixture of argon and oxygen (flow rate ratio 100:1) as the sputtering gas, a pressure of $3.1 \times 10^{-1}$ Pa during sputtering, and a DC sputtering power of 1.7 kW, an ITO thin film was deposited to a thickness of 100 nm. During film deposition, the substrate was at a temperature of 300° C. The ITO thin film thus obtained was analyzed to find a composition of 90.2% by weight $In_2O_3$ and 9.8% by weight $SnO_2$. Heat treatment was omitted. This ITO thin film, designated Sample No. 3, was analyzed for x-ray diffraction as in Experiment 1. The result is shown in FIG. 4. As seen from FIG. 4, a strong peak was observed at about 30° indicating the orientation of (222) face. Table 1 shows the diffraction intensity of (222) face, diffraction intensity of (400) face, diffraction intensity ratio of (400)/(222) face, integrated intensity of (222) face, integrated intensity of (400) face, and integrated intensity ratio of (400)/(222) face.

TABLE 1

| Sample | (222) diffraction intensity (cps) | (400) diffraction intensity (cps) | (400)/(222) intensity ratio | (222) integrated intensity (net) | (400) integrated intensity (net) | (400)/(222) integrated intensity ratio |
|---|---|---|---|---|---|---|
| No. 1 | 9676 | 2341 | 0.24 | 69640 | 14132 | 0.20 |
| No. 2 | 6828 | 1559 | 0.23 | 48833 | 9576 | 0.20 |
| No. 3 | 4457 | 3085 | 0.69 | 42426 | 22299 | 0.53 |

Example 1

On a substrate of Corning (7059) glass, an ITO transparent electrode (hole injecting electrode) was deposited by sputtering as in Experiment 1, which electrode was the same as Sample No. 1. The glass substrate had a surface roughness: Ra≦0.68 nm and Rmax≦2.0 nm. The ITO transparent electrode formed on the substrate had Ra≦0.74 nm and Rmax≦5.6 nm. The ITO transparent electrode was patterned into 5×2 dots with each pixel of 2 mm square size. The ITO electrode on the substrate was subjected to ultrasonic washing with neutral detergent, acetone, and ethanol, pulled up from boiling ethanol, and dried. The surface of the ITO electrode was cleaned with UV/ozone.

Thereafter, the substrate was secured by a holder in a vacuum evaporation chamber, which was evacuated to a vacuum of $1 \times 10^{-4}$ Pa or lower. 4,4', 4"-tris(N-(3-methylphenyl)-N-phenylamino)triphenylamine (m-MTDATA) was evaporated at a deposition rate of 0.1 nm/sec. to a thickness of 40 nm, forming a hole injecting layer. With the vacuum kept, N,N'-diphenyl-N,N'-m-tolyl-4,4'-diamino-1,1'-biphenyl (TPD) was evaporated at a deposition rate of 0.1 nm/sec. to a thickness of 35 nm, forming a hole transporting layer. With the vacuum kept, tris(8-quinolinolato)aluminum (Alq3) was evaporated at a deposition rate of 0.1 nm/sec. to a thickness of 50 nm, forming an electron injecting and transporting/light emitting layer. With the vacuum kept, an Mg-Ag alloy was co-evaporated (two source evaporation) at a weight ratio Mg/Ag of 10/1 to a thickness of 200 nm, forming an electron injecting electrode. Thereafter, the evaporation source was replaced by aluminum whereupon a protective electrode of aluminum was deposited to a thickness of 200 nm. Finally, a sealing glass plate was joined with an adhesive for sealing the device.

With a DC voltage applied across the thus obtained organic EL device, the device was continuously driven at a constant current density of 10 mA/cm. Under 8.0 V, the device initially emitted green light (maximum emission wavelength λmax=530 nm) at a luminance of 620 cd/m². The half life of luminance was 2,000 hours, and the drive voltage rise during the half-life period was 2.8 V. The development and growth of dark spots of a size in excess of 100 μm was not observed during the period.

On ten organic EL device samples obtained as above, all the pixels were examined for diode characteristics (whether or not leakage current was detected). As an examination criterion, those samples whose reverse insulation resistance was 300 MΩ or higher were regarded passed. A percent passage of 100% was marked.

Example 2

An organic EL device was fabricated as in Example 1 except that the ITO transparent electrode was the same as Sample No. 2. It was examined as in Example 1, obtaining equivalent results.

Comparative Example 1

An organic EL device was fabricated as in Example 1 except that the ITO transparent electrode was the same as Sample No. 3.

With a DC voltage applied across the organic EL device, the device was continuously driven at a constant current density of 10 mA/cm². Under 7.9 V, the device initially emitted green light (maximum emission wavelength λmax=530 nm) at a luminance of 600 cd/m². The half life of luminance was 162 hours, and the drive voltage rise during the half-life period was 1.0 V. The development and growth of dark spots of a size in excess of 100 μm was observed during the period.

Similarly, on ten organic EL device samples obtained as above, all the pixels were examined for diode characteristics (whether or not leakage current was detected). As an examination criterion, those samples whose reverse insulation resistance was 300 MΩ or higher were regarded passed. A percent passage of 50% was marked, indicating a significant increase of defective samples as compared with Examples 1 and 2.

Example 3

An organic EL device was fabricated as in Example 1 except that the glass substrate was changed from Corning 7059 glass to soda lime glass which was a silica-coated alkali glass. The glass substrate had a surface roughness: Ra≦1.4 nm and Rmax≦13 nm. The ITO transparent electrode formed on the substrate had Ra≦2.1 nm and Rmax≦20 nm.

The organic EL device was operated as in Example 1. The drive voltage, luminance and other emission characteristics were substantially equivalent to Example 1, but the development and growth of dark spots of a size in excess of 100 μm was observed after 1,500 hours of driving. As in Example 1, the samples were also examined whether or not leakage current was detected. A percent passage of 98% was marked.

There has been described an organic EL device in which an ITO electrode having (111) orientation is used as the hole injecting electrode whereby the film formation, close contact and physical properties at the interface between the hole injecting electrode and the organic layer are improved so that the device may have a long lifetime, high luminance, high efficacy, and quality display. The device can prevent the occurrence of current leakage and dark spots.

The invention has been described in detail with particular reference to preferred embodiments thereof, but it will be understood that variations and modifications can be effected within the spirit and scope of the invention.

What is claimed is:

1. An organic electroluminescent device comprising a substrate having a surface, a hole injecting electrode disposed on the substrate surface, an electron injecting electrode, and at least one organic layer disposed between the electrodes, wherein said hole injecting electrode is an ITO electrode having (111) orientation.

2. The device of claim 1 wherein when analyzed for x-ray diffraction by the rotating crystal method, the ITO electrode exhibits a diffraction intensity ratio of (400)/(222) reflection of up to 0.6.

3. The device of claim 1 wherein when analyzed for x-ray diffraction by the rotating crystal method, the ITO electrode exhibits an integrated intensity ratio of (400)/(222) reflection of up to 0.5.

4. The device of claim 1 wherein said substrate has a mean surface roughness Ra of up to 10 nm and a maximum surface roughness Rmax of up to 50 nm.

5. The device of claim 1 wherein said ITO electrode at its surface remote from said substrate has a mean surface roughness Ra of up to 10 nm and a maximum surface roughness Rmax of up to 50 nm.

6. A method for preparing an organic electroluminescent device comprising the steps of forming an ITO electrode on a substrate at a substrate temperature of 10 to 150° C., and heat treating the electrode at 100 to 450° C.

* * * * *